(12) United States Patent
Liao et al.

(10) Patent No.: US 9,099,647 B2
(45) Date of Patent: Aug. 4, 2015

(54) ONE TRANSISTOR AND ONE RESISTIVE (1T1R) RANDOM ACCESS MEMORY (RAM) STRUCTURE WITH DUAL SPACERS

(71) Applicant: Taiwan Semiconductor Manufacturing Company, Ltd., Hsin-Chu (TW)

(72) Inventors: Yu-Wen Liao, New Taipei (TW);
Wen-Ting Chu, Kaohsiung (TW);
Kuo-Chi Tu, Hsin-Chu (TW);
Chih-Yang Chang, Yuanlin Township (TW); Chin-Chieh Yang, New Taipei (TW); Hsia-Wei Chen, Taipei (TW);
Ching-Pei Hsieh, Kaohsiung (TW)

(73) Assignee: Taiwan Semicnductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/607,955

(22) Filed: Jan. 28, 2015

(65) Prior Publication Data

US 2015/0147864 A1    May 28, 2015

Related U.S. Application Data

(62) Division of application No. 13/787,431, filed on Mar. 6, 2013, now Pat. No. 8,963,114.

(51) Int. Cl.
*H01L 21/20* (2006.01)
*H01L 45/00* (2006.01)
*H01L 27/24* (2006.01)

(52) U.S. Cl.
CPC ........ *H01L 45/1608* (2013.01); *H01L 27/2436* (2013.01); *H01L 27/2463* (2013.01); *H01L 45/1233* (2013.01); *H01L 45/1253* (2013.01); *H01L 45/146* (2013.01)

(58) Field of Classification Search
USPC .............................................. 257/2; 438/382
See application file for complete search history.

(56) References Cited

U.S. PATENT DOCUMENTS

| | | | |
|---|---|---|---|
| 6,849,891 B1 | 2/2005 | Hsu et al. |
| 7,196,370 B2 | 3/2007 | Kai et al. |
| 7,407,858 B2 | 8/2008 | Li et al. |
| 7,795,606 B2 | 9/2010 | Jin et al. |
| 8,000,128 B2 | 8/2011 | Li et al. |
| 8,009,454 B2 | 8/2011 | Lee et al. |

*Primary Examiner* — Marvin Payen
(74) *Attorney, Agent, or Firm* — Slater & Matsil, L.L.P.

(57) ABSTRACT

The present disclosure provides methods of making resistive random access memory (RRAM) cells. The RRAM cell includes a transistor and an RRAM structure. The RRAM structure includes a bottom electrode having a via portion and a top portion, a resistive material layer on the bottom electrode having a width that is same as a width of the top portion of the bottom electrode; a capping layer over the bottom electrode, a first spacer surrounding the capping layer and a top electrode, a second spacer surround the top portion of the bottom electrode and the first spacer, and the top electrode. The RRAM cell further includes a conductive material connecting the top electrode of the RRAM structure to a metal layer.

20 Claims, 11 Drawing Sheets

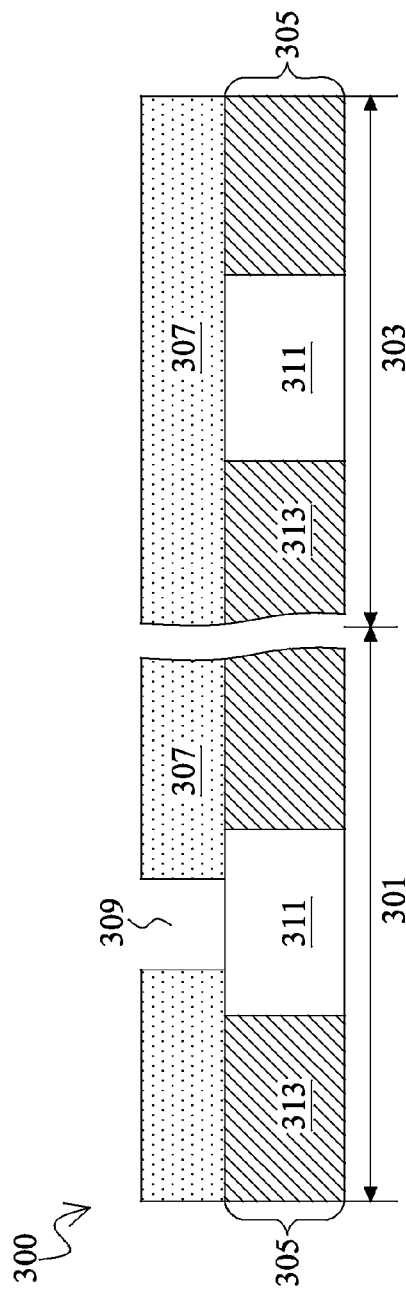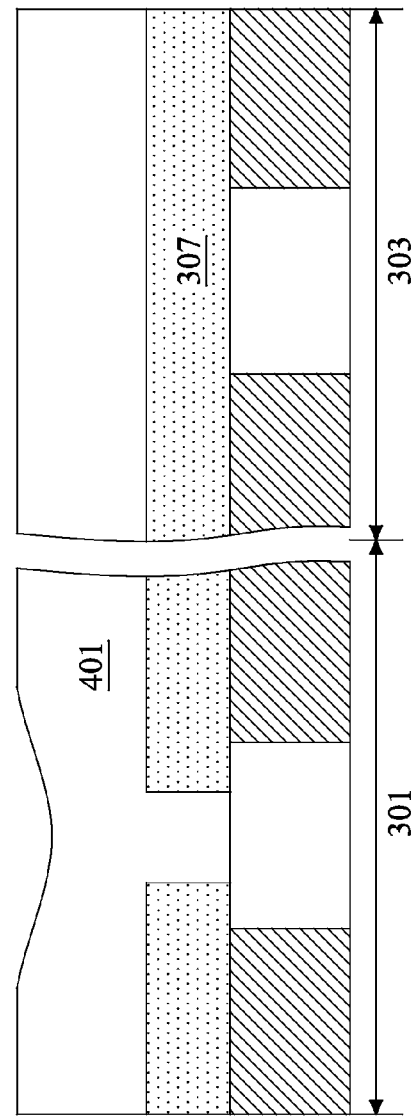

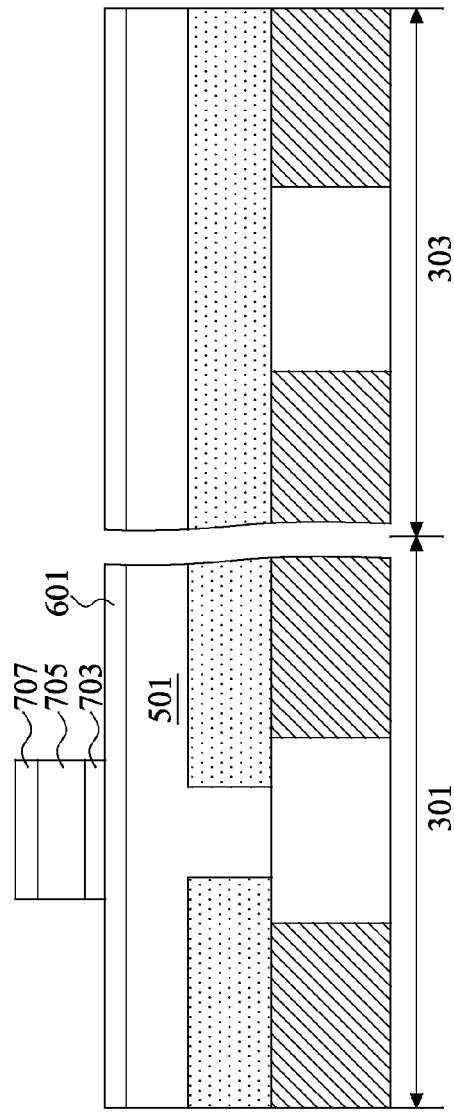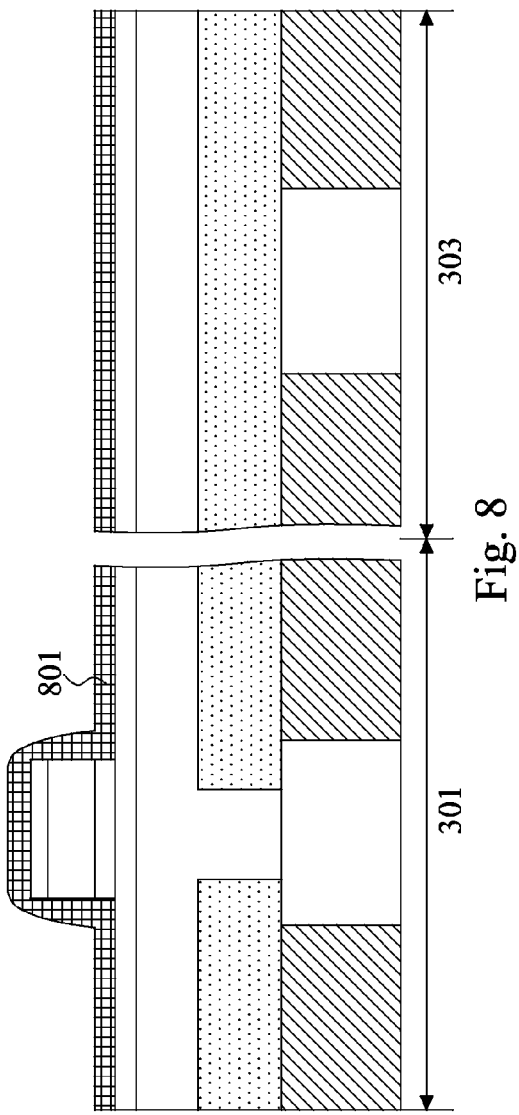

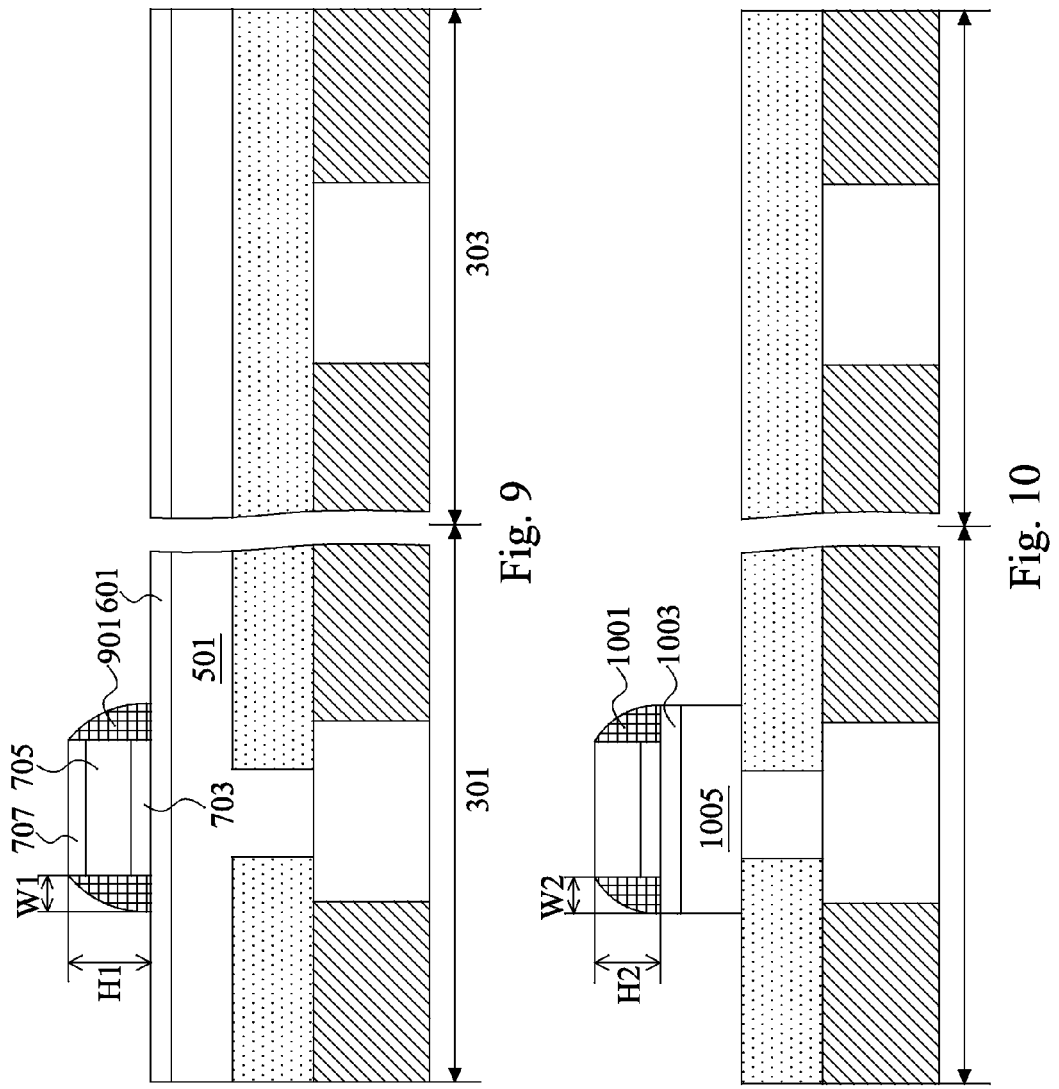

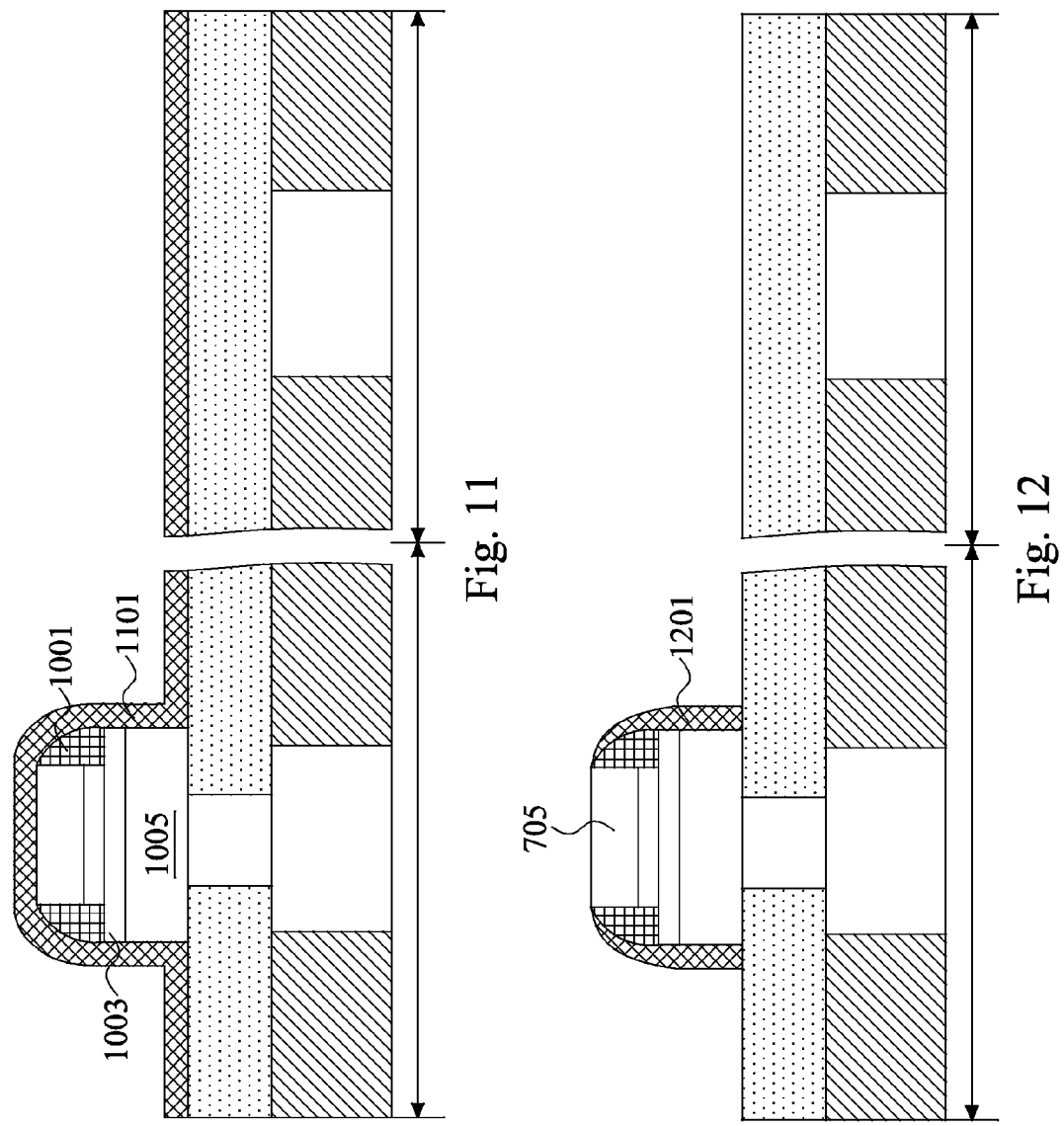

ONE TRANSISTOR AND ONE RESISTIVE (1T1R) RANDOM ACCESS MEMORY (RAM) STRUCTURE WITH DUAL SPACERS

PRIORITY CLAIM

This application claims priority to as a divisional of U.S. patent application Ser. No. 13/787,431, filed Mar. 6, 2013, and entitled "One Transistor and One Resistive (1T1R) Random Access Memory (RAM) Structure With Dual Spacers," which application is incorporated herein by reference.

FIELD

The disclosure relates to semiconductor devices and, more particularly, to resistive random-access memory (RRAM) device structures and methods for making the RRAM devices.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values, rather than electronic charge. Particularly, each RRAM cell includes a resistive material layer, the resistance of which can be adjusted to represent logic "0" or logic "1." RRAM devices operate under the principle that a dielectric, which is normally insulating, can be made to conduct through a filament or conduction path formed after the application of a sufficiently high voltage. The forming of a filament or conduction path is the forming operation or forming process of the RRAM. The sufficiently high voltage is the 'form' voltage. The conduction path formation can arise from different mechanisms, including defect, metal migration, and other mechanisms. Various different dielectric materials may be used in RRAM devices. Once the filament or conduction path is formed, it may be reset, i.e. broken, resulting in high resistance or set, i.e. re-formed, resulting in lower resistance, by an appropriately applied voltage. There are various architectures to configure an array of RRAM cells. For example, a cross-point architecture include a RRAM in each cell configured between crossed a word line and a bit line. Recently, a transistor type architecture pairs a RRAM with a transistor (1T1R) in each cell is proposed that can improve random access time. However, improvements in 1T1R RRAM cell and method of manufacturing continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3-16 are cross sectional diagrams of a partially fabricated RRAM structure in various stages of fabrication in accordance with various embodiments of the present disclosure.

DETAILED DESCRIPTION

Figure 1:
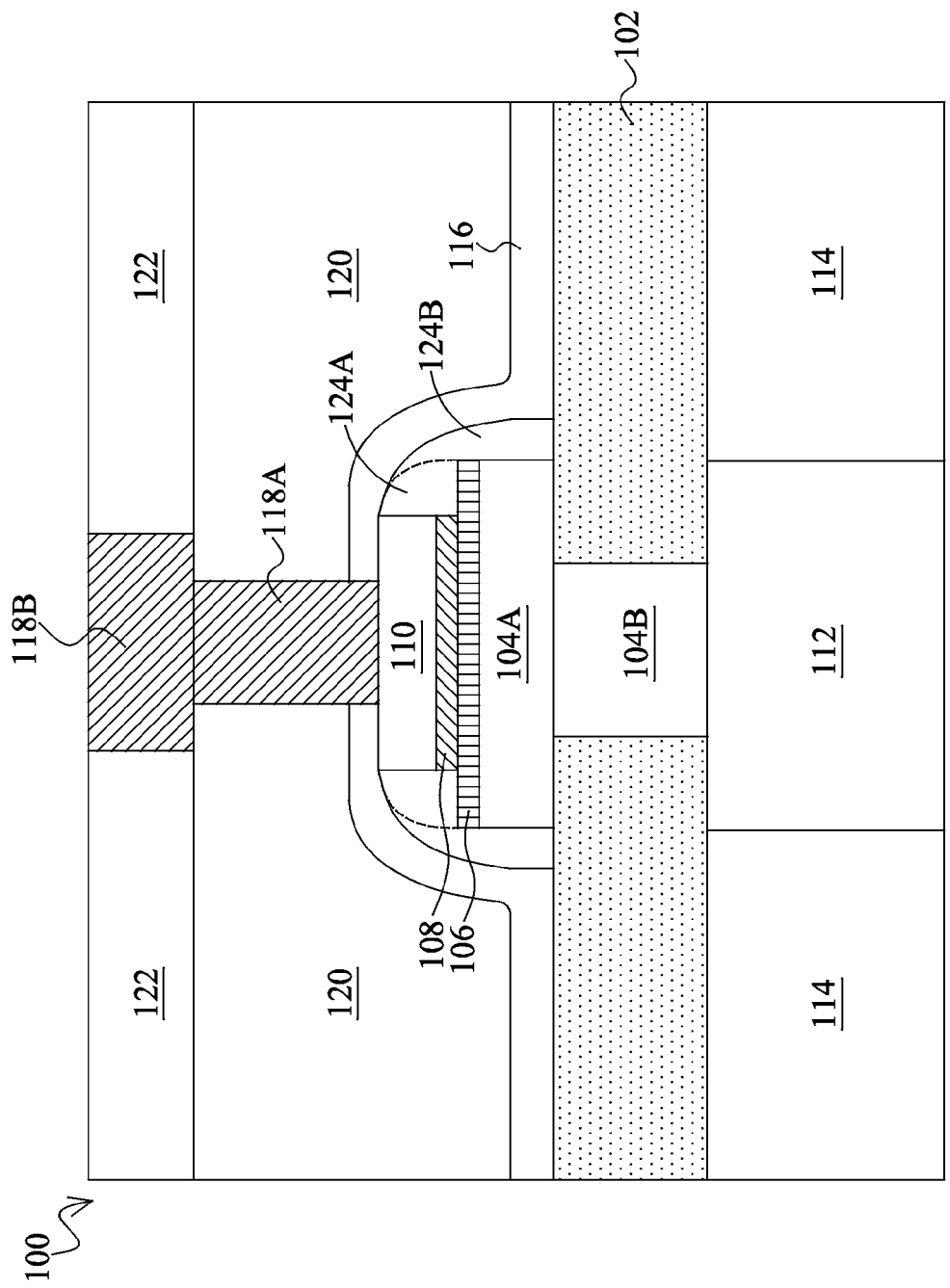
FIG. 1 is a cross sectional view of a resistive random access memory (RRAM) structure in accordance with various embodiments of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" other elements or features would then be oriented "above" the other elements or features. Thus, the exemplary term "below" can encompass both an orientation of above and below.

FIG. 1 is a cross sectional view of a resistive random access memory (RRAM) structure embedded in a multilevel interconnect (MLI) structure over a transistor in accordance with various embodiments of the present disclosure. The RRAM structure 100 includes a bottom electrode 104A/B in and over a RRAM stop layer 102, a resistive material layer 106, a capping layer 108, and a top electrode 110. The bottom electrode is composed of two portions, a via portion 104B embedded in the RRAM stop layer 102 and a top portion 104A over the via portion and the RRAM stop layer 102. A metal/dielectric layer is disposed below the RRAM stop layer 102 and includes one or more metal features 112 embedded in dielectric layer 114. The capping layer 108 is disposed between the top electrode 110 and the resistive material layer 106. A first spacer 124A surrounds the capping layer 108 and the top electrode 110. A second spacer 124B surrounds the first spacer 124A, the resistive material layer 106, and the top portion 104A of the bottom electrode. A second RRAM stop layer 116 covers the top electrode 110 and the second spacer 124B. A contact material having two portions: a via contact 118 A and a metal feature 118B electrically connects to the top electrode 110 through the second RRAM stop layer 116. A dielectric material 120 fills the regions between RRAM structures 100 over the second RRAM stop layer 116. Another dielectric material 122 is disposed over the dielectric material 120 and the metal feature 118B is embedded therein. The dielectric material 120 may be formed of the same material as the dielectric material 122 and also dielectric layer 114.

According to various embodiments, the top electrode 110 has a width that is smaller than the width of the top portion of the bottom electrode 104A. The capping layer 108 has the same width as the top electrode 110. The resistive material layer 106 has the same width as the bottom electrode 104A. The difference in the width of the resistive material layer 106 and the top electrode 110 is the width of the first spacer 124A.

In other words, the first spacer 124A is aligned with the resistive material layer 106 and the top portion of the bottom electrode 104A.

The first spacer 124A protects the capping layer and masks the resistive material layer and bottom electrode during bottom electrode etching. In some embodiments, the first spacer 124A is referred to as a first protective layer. The first spacer 124A reduces or prevents sidewall damage at the capping layer and the top electrode. When compounded with a thin or broken resistive material layer, such sidewall damage can form a leakage path that can lead to cell leakage. When the RRAM is in a high resistance state, a low resistance would be read instead with cell leakage. The first spacer 124A effectively passivates the corner region of where the capping layer 108 and the resistive material layer 106 meet and prevent a leakage path from forming.

The second spacer 124B protects the sidewalls of the resistive material layer 106 and the top portion of the bottom electrode 104A during subsequent processing and operation. In some embodiments, the second spacer 124B is referred to as a second protective layer. The second spacer prevents oxygen from diffusing into the RRAM and creating a leakage path. Such leakage path renders the RRAM defective because certain data cannot be retained.

As shown in FIG. 1, an interface between first spacer 124A and second spacer 124B is shown in dotted lines. When the first spacer 124A and second spacer 124B are the same material, the interface may be undetectable. In some embodiments, the first spacer and the second spacer are separately by a thin film of fluorine-containing material that is otherwise the same as the first spacer. In some embodiments, the first spacer and the second spacer include different material. For example, the first spacer may be silicon nitride and the second spacer may be silicon carbide or carbon-doped silicon nitride. When the first spacer and the second spacer include different materials, the interface between them is easily detected.

The RRAM structure 100 has two or more states with different electric resistance values that correspond to a different digital value. The RRAM structure 100 switches from one state to another in response to application of a predetermined voltage or current to the RRAM structure 100. For example, the RRAM structure 100 has a state of relatively high resistance, referred to as "a high resistance state", and a state of relatively low resistance, referred to as "a low resistance state". The RRAM structure 100 may be switched from the high resistance state to the low resistance state, or from the low resistance state to high resistance state by applying a predetermined voltage or current to the electrodes.

In a memory bit cell having one transistor and one RRAM (1T1R) the bottom electrode 104A/B is electrically connected to a drain electrode of a transistor through the MLI. In some embodiments, the RRAM structure is placed between the fourth metal layer (M4) and the fifth metal layer (M5). In other embodiments, the RRAM structure is placed between other metal layers. In still other embodiments, the RRAM structure is placed more than once between more than two metal layers. The RRAM structure may be placed more than once when the footprint of the RRAM is larger than that of the corresponding transistor so that a one transistor one RRAM match cannot be made in one layer of RRAM.

The bottom electrode 104A/B may be made of gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the bottom electrode 104 may be between a range about 100-500 nm. In some embodiments, the bottom electrode includes a via portion and a top portion. The via portion may include one or more layers and may be a conductive barrier material to a metal feature below. The top portion may also include one or more layers. In one embodiment, the bottom electrode includes a tantalum nitride layer and a titanium nitride layer.

A resistive material layer 106 is formed on the bottom electrode 104 and directly contacts to the bottom electrode 104. The thickness of the resistive material layer 106 may be between a range about 20-100 nm. The resistive material layer may include one or more oxide of W, Ta, Ti, Ni, Co, Hf, Ru, Zr, Zn, Fe, Sn, Al, Cu, Ag, Mo, Cr. In some cases, silicon may be included to form a composite material. In some embodiments, hafnium oxide and/or zirconium oxide is used.

A top electrode 110 is formed over the resistive material layer 106. The top electrode 110 may be formed from materials such as gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the top electrode 110 may be between a range about 100-500 nm.

An 1T1R memory cell is controlled through at least four electrical connections to read, write, and form the memory cell. A gate contact to the transistor controls a gate voltage that allows a channel region to conduct. A body contact may be used to connect to the semiconductor substrate and provide a ground or bias the transistor. A source line contact is connected to the top electrode 110; and, a bit line contact is connected to the source region contact of the transistor.

During memory cell 'form' operation, a specified voltage is conducted across the RRAM structure between the bottom electrode 104A/B and the top electrode 110. The voltage is provided through the transistor from the bit line contact across to the source line contact. The 'form' voltage is usually a different voltage from the voltage used to read and write the memory cell and is usually at a higher absolute value or has a different polarity. In one example, the voltage difference may be 3 volts or greater, or about 5 volts. During the 'form' operation, a bias may be provided via the body contact. In some embodiments, the 'form' voltage is provided directly through the MLI while bypassing the transistor associated with the memory cell. If polymer residues from the bottom electrode etching and damages to the top surface of the resistive material layer 106 provide a conducting path, current may leak through this path instead of causing the formation of filaments across the resistive material layer 106. However, with the spacers 124A/B, which may also be referred to as the protective layer, the existence of polymer residues and damages to the top surface of the resistive material layer 106 close to the capping layer 108 sidewall and/or the resistive material layer 106 sidewall are minimized and no such leakage path is created.

After the 'form' operation, one or more filament conductors are disposed across the resistive material layer 106. The resistance across the resistive material layer 106 is at a low value and a high current may be passed when the transistor is selected. During the write operation, the one or more filament conductors are broken by passing a voltage different from the 'form' voltage. In some embodiments, the 'write' voltage may have a different polarity than the 'form' voltage. In one example, the voltage difference is about 1 volt. After the one or more filament conductors are broken, the resistance across the resistive material layer 106 is at a high value and hence a low current or no current may be passed when the transistor is selected. A subsequent write operation applies yet a different voltage that is less than the 'form' voltage to reconnect the broken filament conductors. By changing the filament conductors, a high or low resistance is stored in the memory cell that does not change when the power is removed. Either the high resistance or the low resistance may be read as a "0" or "1", respectively. During a read operation, a 'read' voltage is applied across the RRAM structure. In some examples, the 'read' voltage is between about 0.3 volts to about 0.5 volts. The 'read' voltage is much smaller than the 'write' voltage to avoid inadvertent writing of the memory cell to a different value.

A memory cell is usually connected to an array of memory cells either embedded in a logic device or as a stand-alone memory device. Memory cell arrays are organized into bit lines and word lines. The bit line contact is connected to the bit line of the memory cell array and the gate contact is connected to the word line of the memory cell array.

Figure 2:
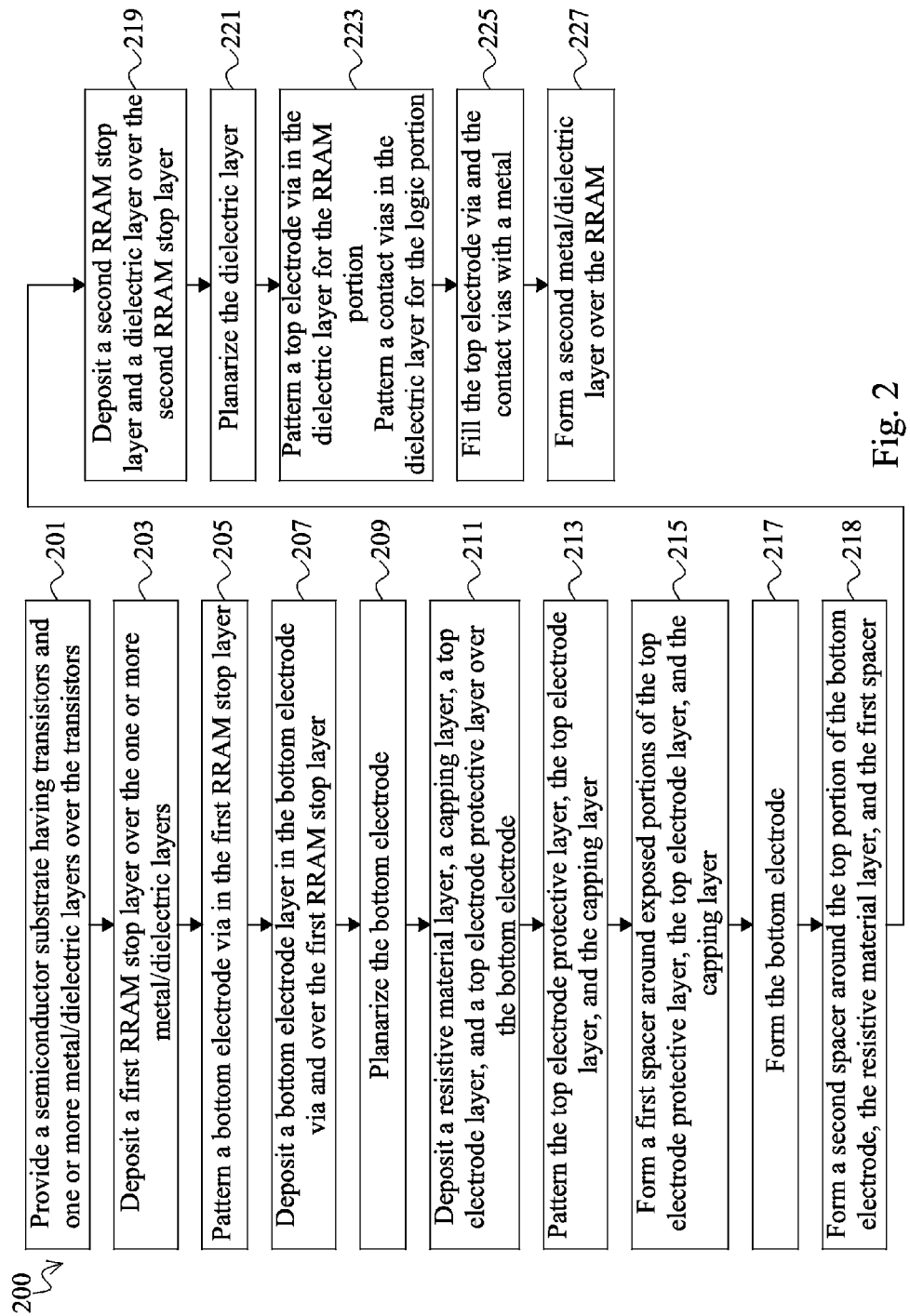
FIG. 2 is a flowchart of a method making of a RRAM cell according to aspects of the present disclosure in various embodiments.

FIG. 2 is a flowchart of a method 200 for making a memory device according to aspects of the present disclosure in various embodiments. Various operations of the method 200 are discussed in association with cross-section diagrams 3-11. In operation 201 of method 200, a semiconductor substrate having transistors and one or more metal/dielectric layers over the transistors is provided. The semiconductor substrate may be a silicon substrate. Alternatively, the substrate may comprise another elementary semiconductor, such as germanium; a compound semiconductor including silicon carbide; an alloy semiconductor including silicon germanium; or combinations thereof. In some embodiments, the substrate is a semiconductor on insulator (SOI) substrate. The substrate may include doped regions, such as p-wells and n-wells. In the present disclosure, a wafer is a workpiece that includes a semiconductor substrate and various features formed in and over and attached to the semiconductor substrate. The wafer may be in various stages of fabrication and is processed using the CMOS process. The transistors are formed by known transistor fabrication processes and may be a planar transistor, such as polysilicon gate transistors or high-k metal gate transistors, or a multi-gate transistor, such as fin field effect transistors. After the transistors are formed, one or more metal/dielectric layers of a multi-level interconnect (MLI) is formed over the transistors. According to some embodiments, four metal/dielectric layers are formed over the transistors.

In operation 203, a first RRAM stop layer is deposited over the one or more metal/dielectric layers. The first RRAM stop layer may be silicon carbide, silicon oxynitride, silicon nitride, carbon doped silicon nitride or carbon doped silicon oxide. The first RRAM stop layer is selected to have a different etch selectivity than the bottom electrode material. Another selection criterion is the design requirements of the logic device portion (portion 303 of FIGS. 3-11). The first RRAM stop layer is deposited over a planarized metal/dielectric layer using a chemical vapor deposition (CVD) process such as plasma enhanced (PE) CVD, high-density plasma (HDP) CVD, inductively-coupled-plasma (ICP) CVD, or thermal CVD.

In operation 205, a bottom electrode via is patterned in the first RRAM stop layer. The bottom electrode via is formed by first depositing a photoresist over the first RRAM stop layer, exposing a portion of the photoresist to a radiation, developing the photoresist, and etching the bottom electrode via in the first RRAM stop layer using the photoresist as an etch mask. In some embodiments, a bottom electrode having only one section may be used. For example, the entire bottom electrode may be embedded in the first RRAM stop layer. In such embodiments, the bottom electrode via is patterned to have the width of the bottom electrode, which may be larger or smaller than a width of the metal feature below.

FIG. 3 is a cross section diagram of portions of a wafer after operation 205. The wafer 300 includes a RRAM portion 301 and a logic device portion 303. Various operations of method 200 are performed in the RRAM portion 301 and conventional MLI formation is performed in the logic device portion 303. The transistor and metal/dielectric layers below the RRAM level are not shown. The cross section of FIG. 3 includes a metal/dielectric layer 305 including both metal feature 311 and dielectric material 313. A first RRAM stop layer 307 is deposited over the metal/dielectric layer 305 for both the RRAM portion 301 and the logic device portion 303. A bottom electrode via 309 is formed in the first RRAM stop layer 307 over the metal feature 311 in the RRAM portion 301.

Referring back to FIG. 2, in operation 207, a bottom electrode layer is deposited in the bottom electrode via and over the first RRAM stop layer. The bottom electrode layer may be tantalum nitride, titanium nitride, tungsten, or copper deposited using a physical vapor deposition (PVD) process or a plating process. In some cases, a liner or a barrier layer may be deposited first, followed by a deposition of the bulk material using one of the known deposition methods. Because the bottom electrode layer deposition fills the bottom electrode via and covers the first RRAM stop layer, the portion of the bottom electrode layer over the bottom electrode via may have different thickness above the bottom electrode via as compared to the bottom electrode layer not over the bottom electrode via. FIG. 4 is a cross section diagram of portions of a wafer after operation 207 including a bottom electrode layer 401 over the first RRAM stop layer. As shown in FIG. 4, a top surface of the bottom electrode layer 401 may be uneven over the bottom electrode via.

Figure 5:
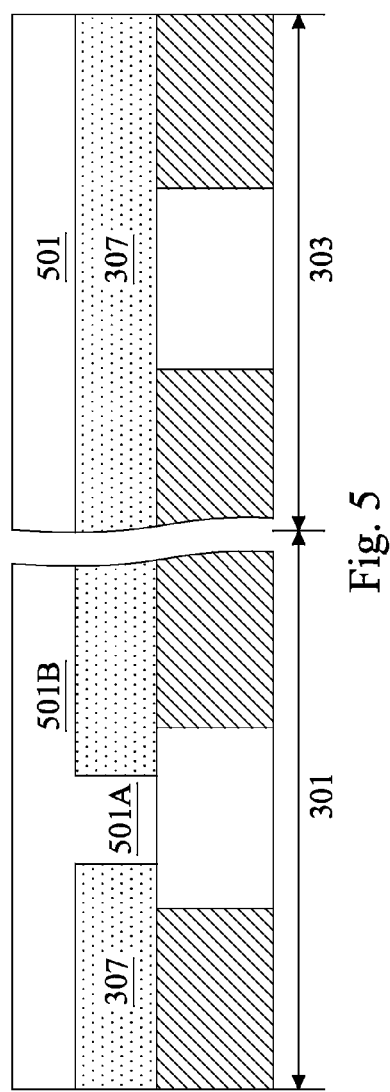

Referring back to FIG. 2, in operation 209 the bottom electrode is planarized. The planarization is performed with a chemical mechanical polishing (CMP) process. The planarization is tuned to minimize thickness variations of the top portion of the bottom electrode. Referring to FIG. 5, the bottom electrode layer 501 includes a top portion 501A and via portion 501B. After the planarization, the top surface of the bottom electrode layer portion 501A is planar and the dishing shown in FIG. 4 disappears. The high uniformity of the top portion 501A of the bottom electrode provides a uniform electric field during operation and increases the accuracy of the memory cell.

Referring back to FIG. 2, in operation 211 a resistive material layer, a capping layer, a top electrode layer, and a top electrode protective layer is deposited sequentially over the bottom electrode. The resistive material layer of the RRAM is a metal oxide, which may be hafnium oxide, zirconium oxide, aluminum oxide, nickel oxide, tantalum oxide, titanium oxide, and other known oxides used as a resistive material layer. The metal oxide may have a non-stoichiometric oxygen to metal ratio. Depending on the method of deposition, the oxygen to metal ratio and other process conditions may be tuned to achieve specific resistive material layer properties. For example, a set of conditions may yield a low 'forming' voltage and another set of conditions may yield a low 'read' voltage. The metal oxide may be deposited. In some embodiments, the metal oxide is a transition metal oxide. In other embodiments, the resistive material layer is a metal oxynitride.

The resistive material layer may be formed by a suitable technique, such as atomic layer deposition (ALD) with a precursor containing a metal and oxygen. Other chemical vapor deposition (CVD) techniques may be used. In another example, the resistive material layer may be formed by a physical vapor deposition (PVD), such as a sputtering process with a metallic target and with a gas supply of oxygen and optionally nitrogen to the PVD chamber. In yet another example, the resistive material layer may be formed an electron-beam deposition process. The resistive material layer may have a thickness ranging between about 20 angstroms and about 100 angstroms, or between about 40 angstroms and about 100 angstroms. Thicker resistive material layers result in higher forming voltage. However, a thin resistive material layer may be susceptible to current leakage if over etched and is more sensitivity to surface and thickness non-uniformity.

The capping layer of the RRAM over the resistive material layer is a metal. In various embodiments, the capping layer is a metal, for example, titanium, hafnium, platinum, and tantalum. The capping layer may be deposited using a PVD process, a CVD, for example, an ALD process. The capping layer may have a thickness ranging between about 20 angstroms and about 100 angstroms, or between about 40 angstroms and about 80 angstroms.

The top electrode may be metal, metal-nitride, doped polysilicon or other suitable conductive material. For example, the top electrode may be tantalum nitride, titanium nitride, or platinum. The top electrode may be formed by PVD, CVD including ALD, or other suitable technique and has a thickness ranging between about 100 angstrom and about 500 angstroms. Alternatively, the top electrode includes other suitable conductive material to electrically connect the device to other portion of an interconnect structure for electrical routing.

The top electrode protective layer is a hardmask material used for shaping the first spacer and optionally the second spacer. A thickness of the top electrode protective layer depends on the width of the first spacer, or the difference of the widths of resistive material layer and the top electrode. In some embodiments, a silicon oxynitride is used. Silicon oxynitride has a good etch selectivity against the bottom electrode metal. Other hardmask material including silicon carbide, carbon-doped silicon nitride, or silicon nitride may be used. According to some embodiments, a silicon oxynitride layer having a thickness greater than about 200 angstroms is deposited.

Figure 6:
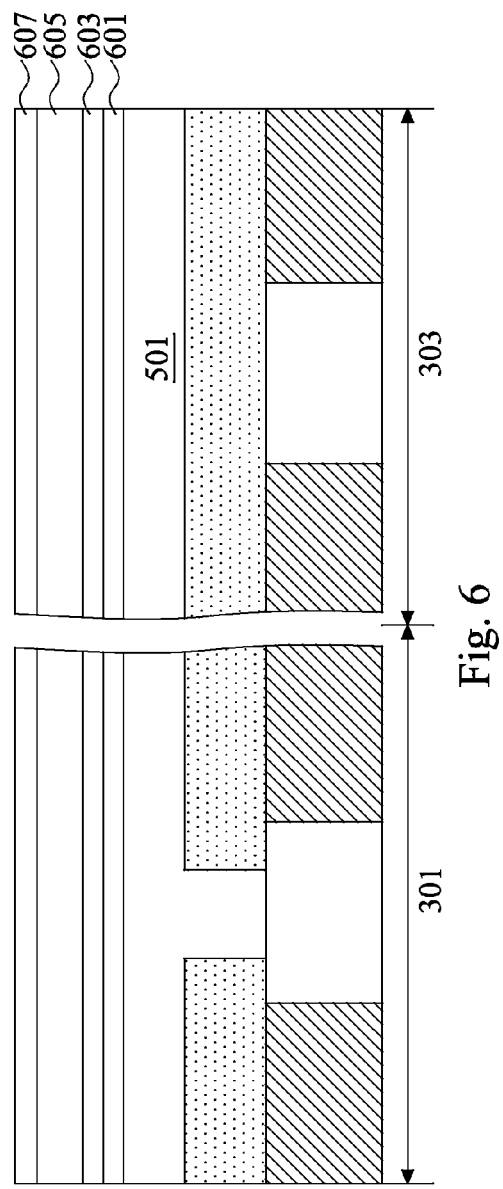

In some embodiments, the layers are deposited in one system without breaking vacuum. Specifically, one or more of the layers may be deposited in the same chamber or each one in a different chamber on the same vacuum system. In other embodiments, more than one semiconductor processing system is used. FIG. 6 is the cross section diagram showing top electrode protective layer 607 over top electrode layer 605 over capping layer 603 over resistive material layer 601 over the bottom electrode 501.

Referring back to FIG. 2, in operation 213 the top electrode is patterned. The patterning includes a photolithography operation where a photoresist is deposited, a pattern is defined by exposing photoresist to a radiation, and developing the photoresist to create a photoresist pattern. The photoresist pattern is then used as an etch mask to protect desired portions of the RRAM structure. As shown in FIG. 7, a portion of the top electrode protective layer, top electrode layer and a portion of the capping layer are removed from the RRAM portion 301 of the wafer. All of the top electrode protective layer, top electrode layer and capping layer are removed from the logic device portion 303 of the wafer. As shown in FIG. 7, a top electrode protective layer 707, a top electrode 705 and a capping layer 703 having a same width remain over the resistive material layer 601. In some embodiments, the capping layer and the top electrode may be formed of the same material, but using different processes so as to vary a specific material property. In other embodiments, the capping layer is a metal and the top electrode layer is a metal nitride, for example, the capping layer may be titanium and the top electrode a tantalum nitride. The etch process stops when the resistive material layer 601 is reached. Techniques are available to detect the end of etching when a new material layer is reached so as to limit the amount of over etching. Because the resistive material layer 601 may be as thin as 40 angstroms, a large amount of over etching cannot be tolerated because the resistive material layer 601 would be removed or damaged.

Referring back to FIG. 2, in operation 215 a spacer is formed around exposed portions of the top electrode protective layer, the top electrode layer, and the capping layer. The spacer material may be silicon nitride, silicon carbide, or silicon carbon nitride. The spacer material is a protective film covering the top and sidewalls of the top electrode protective layer, top electrode, and capping layer. As shown in FIG. 8, the spacer material 801 is deposited over the resistive material layer in the logic device portion 303 as well as the RRAM portion 301. The spacer material 801 conformally coats the sidewalls of the top electrode protective layer 707, the top electrode 705 and the capping layer 703. The spacer is then etched to remove the field portions of the spacer material 801. Because of the shape of the conformal deposition, the spacer material 801 in the open regions such as the logic device portion 303 and over the top electrode 705 is removed during this etch. A small portion remains as first spacer 901 as shown in FIG. 9. First spacer 901 surrounds and protects the sidewalls of the top electrode protective layer 707, the top electrode 705, and capping layer 703 and a top portion of the surface modification layer 601 during subsequent etch operations. First spacer 901 has a height H1 and a width W1. The height and width of first spacer 901 after etching may be tuned by adjusting deposition and etching parameters. In some embodiments, a small portion of the top electrode protective layer 707 is consumed to ensure that the spacer material 801 in the field regions is completely removed. According to various embodiments, at least between about 150 angstroms and about 200 angstroms of the top electrode protective layer 707 remains.

According to various embodiments, the spacer etching is performed without patterning first because the shape of the conformal spacer material 801 can be etched to form the first spacer 901. However, other first spacer shapes may be formed by patterning the spacer material first before etching. If a pattern is used, the first spacer may be formed of any shape.

Referring back to FIG. 2, in operation 217 the bottom electrode is formed. The first spacer 901 is used as an etchmask to remove a portion of the resistive material layer 601 and bottom electrode layer 501 of FIG. 9 to form the resistive material layer 1003 and the bottom electrode 1005. Because the resistive material layer 1003 and the bottom electrode 1005 are formed by etching without using a photoresist, polymer deposits on sidewalls of the resistive material layer 1003 and the bottom electrode 1005 that can cause cell leakage is minimized. During the etching, the etchant also attacks the top electrode protective layer 707 material such that by the time the unwanted portions of the bottom electrode are removed, top electrode protective layer 707 may be consumed as well. In some embodiments, a small portion of the top electrode protective layer 707 remains, for example, about 30 angstroms. However, even if the top electrode protective layer 707 is consumed, a first spacer 1001 portion remains. The first spacer 1001 portion has a height H2 and width W2 that are respectively smaller than the height H1 and width W1. In one example, the ratio of W2/W1 is about 85%.

Referring back to FIG. 2, in operation 218 a second spacer is formed around the top portion of the bottom electrode, the resistive material layer, and the first spacer. The second spacer material may be silicon nitride, silicon carbide, or silicon carbon nitride. The second spacer material may be a same material as the first spacer or a different material. As shown in FIG. 11, the second spacer material 1101 is deposited in the logic device portion 303 as well as the RRAM portion 301. The spacer material 1101 conformally coats the sidewalls of the first spacer 1001, the resistive material layer 1003, and the top portion 1005 of the bottom electrode. The spacer is then etched to remove the field portions of the spacer material 1101. Because of the shape of the conformal deposition, the spacer material 1101 the open regions such as the logic device portion 303 and over the top electrode 705 is removed during this etch. A small portion remains as second spacer 1201 as shown in FIG. 12. Second spacer 1201 surrounds and protects the sidewalls of the first spacer 1001, the resistive material layer 1003, and top portion 1005 of the bottom electrode. The second spacer 1201 has a height H3 and a width W3. The height H3 and width W3 of the second spacer 1201 after etching may be tuned by adjusting deposition and etching parameters. In some embodiments, the top electrode protective layer 707 is completely consumed. In other embodiments, a small portion of the top electrode 705 is etched to ensure that the spacer material 1101 in the field regions is completely removed.

Figure 13:
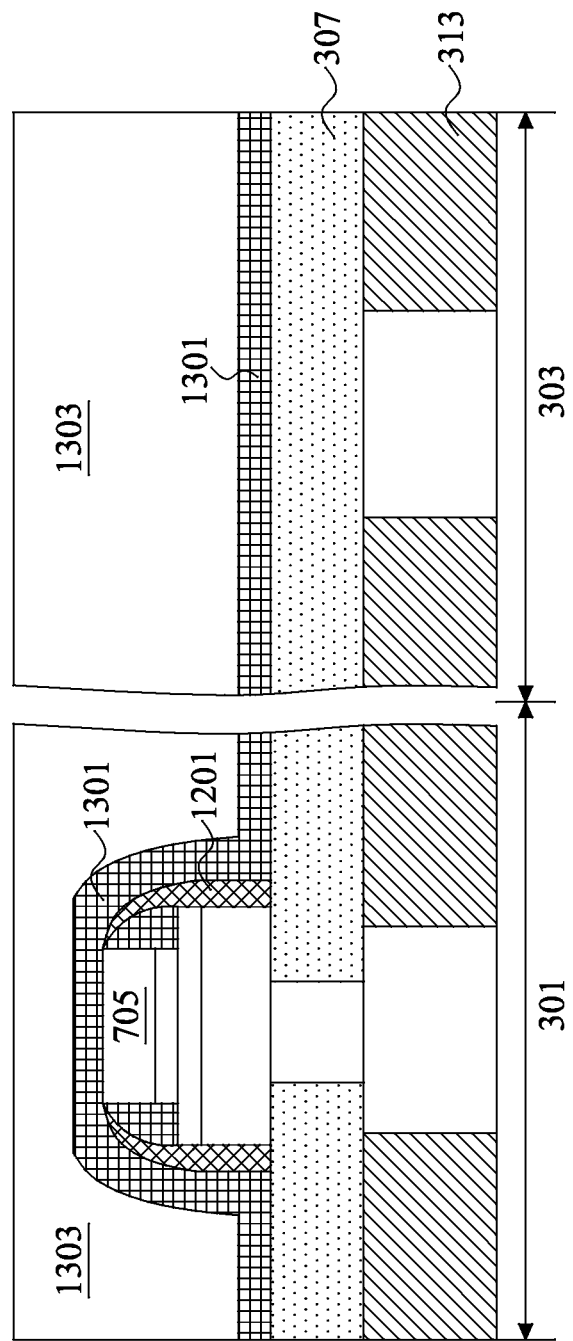

Referring back to FIG. 2, in operation 219 a second RRAM stop layer and a dielectric layer over the second RRAM stop layer is deposited. The second RRAM stop layer may be the same material as the first RRAM stop layer. The second RRAM stop layer may be silicon carbide, silicon oxynitride, silicon nitride, carbon doped silicon nitride or carbon doped silicon oxide. The second RRAM stop layer is selected to have a different etch selectivity than the overlying dielectric layer material. The second RRAM stop layer is deposited conformally over the RRAM structure using a chemical vapor deposition (CVD) process such as plasma enhanced (PE) CVD, high-density plasma (HDP) CVD, inductively-coupled-plasma (ICP) CVD, or thermal CVD. The conformity process window depends partially on the aspect ratio of the RRAM structure, which depends on the top electrode thickness. Thus in various embodiments, the top electrode thickness is not more than 500 angstroms. FIG. 13 shows a second RRAM stop layer 1301 over and around the second spacer 1201 and the top electrode 705 in the RRAM region 301 and over the first RRAM stop layer 307 in the logic region 303.

A dielectric layer is deposited over the second RRAM stop layer. The dielectric layer may be the same material as the dielectric material 313 in the metal/dielectric layer 305 of FIG. 3. The dielectric layer may be silicon oxide, low-k silicon oxide such as a porous silicon oxide layer, or other commonly used interlayer dielectric (ILD) material. The dielectric layer completely fills the area between RRAM structures and covers the RRAM structures.

Referring back to FIG. 2, in operation 221 the dielectric layer is planarized. Depending on the method of deposition, the dielectric layer may have an uneven top surface. During subsequent contact etch, an uneven top surface may cause unwanted overetching and some portion and underetching in other portions. A CMP process is usually used to planarize the dielectric layer. FIG. 13 shows a planarized dielectric layer 1303 over the second RRAM stop layer 1301.

A top electrode via and a contact via are patterned in operation 223. The top electrode via extends from the top of the dielectric layer to the top electrode. Operation 223 may be performed in multiple steps: in a first step, a first pattern and etch stops on top of the second RRAM stop layer in the RRAM portion and in a second step, the second RRAM stop layer is etched through to the top electrode. The first step of pattern and etch is performed using known processes. The subsequent step of etching through the second RRAM stop layer may be performed together with contact etching in the logic device.

Then, a contact via is patterned in the dielectric layer for the logic portion. The contact via extends from the top of the dielectric layer to the metal features in the metal/dielectric layer below the first RRAM stop layer. A first pattern and etch stops on top of the first RRAM stop layer in the logic portion and subsequently, the first RRAM stop layer is etched through to the metal feature in the metal/dielectric layer. The first step of pattern and etch is performed using known processes. The subsequent step of etching through the first RRAM stop layer may be performed together with top electrode via etching in the RRAM portion.

Figure 14:
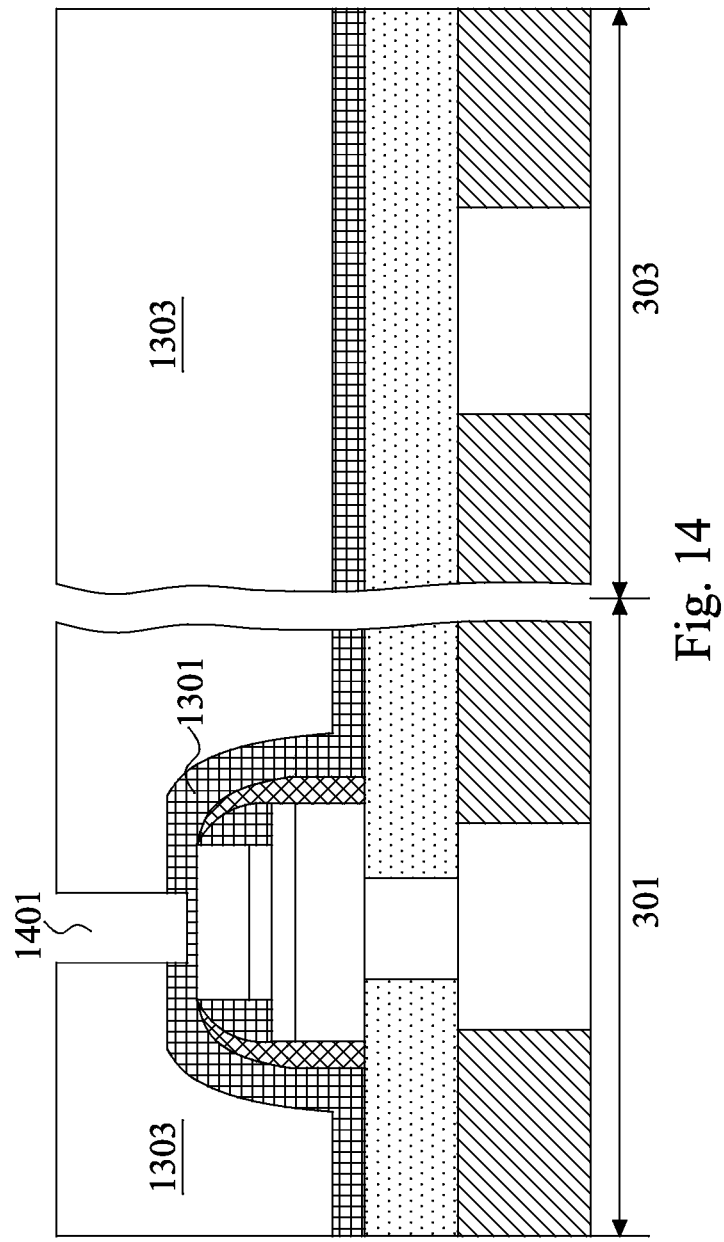

FIG. 14 is a cross section view after the top electrode via etch. The RRAM structure is conformally covered by second RRAM stop layer 1301. A dielectric layer 1303 fills the space between RRAM structures and covers the RRAM structure. A top electrode via 1401 is etched in the dielectric layer 1303 down to the second RRAM stop layer 1301. In the embodiment as shown, the top electrode via 1401 does not reach the top electrode; however, the top electrode via 1401 is extended in a subsequent operation to the top electrode to form electrical connection with the RRAM structure.

Figure 15:
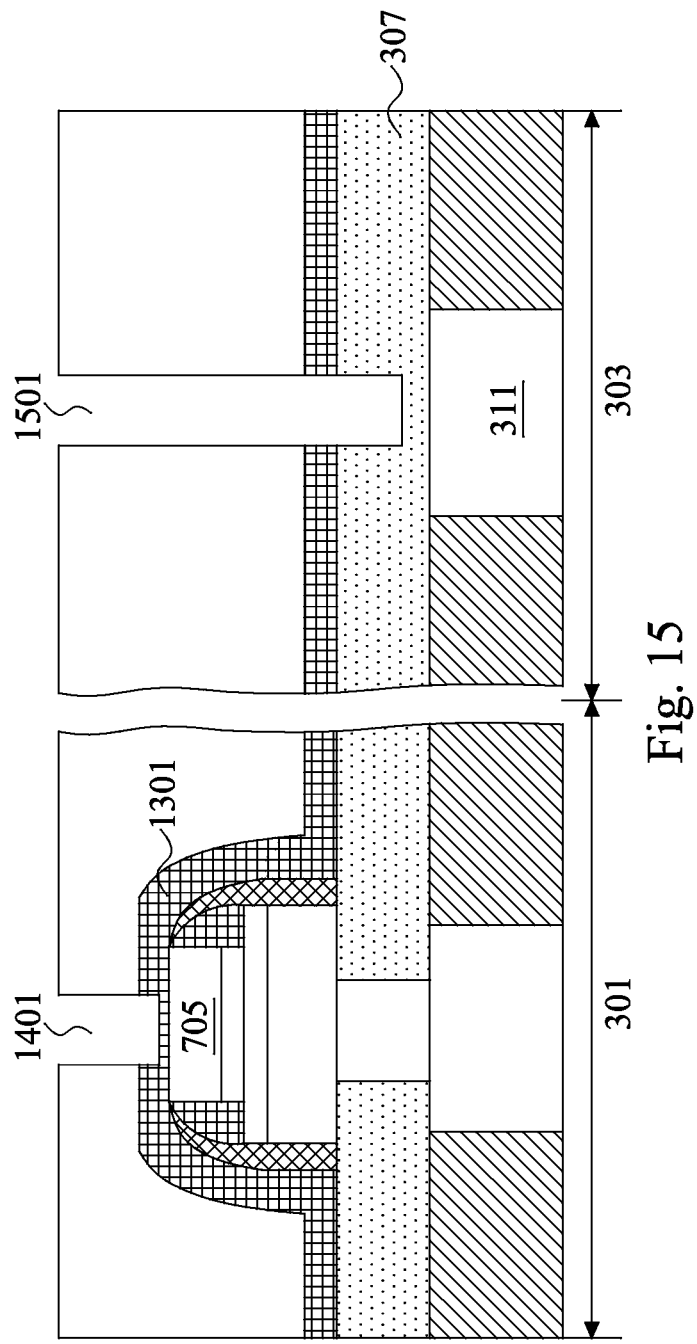

FIG. 15 is a cross sectional diagram including an RRAM portion 301 and a logic device portion 303 in an intermediate stage after the initial top electrode etch and contact via etch. In the RRAM portion 301 of FIG. 15, the top electrode via 1401 is formed, with a small portion of the second RRAM stop layer remaining at the bottom of the top electrode via 1401. In the logic device portion 303 of FIG. 15, the contact via 1501 is formed, with a small portion of the first RRAM stop layer 307 remaining at the bottom of the contact via 1501. Because the depths of the top electrode via 1401 and the contact via 1501 varies as well as the material composition etched, the top electrode etch and the contact via etch may be performed separately to ensure good process uniformity using two photomasks—one for patterning the top electrode via and one for patterning the contact via. In some embodiments, at least a portion of contact via 1501 could be etched simultaneously with the etching of top electrode via 1401, followed by masking top electrode via 1401 and continuing with the etching of the remainder of the contact via 1501. The remaining portion of the second RRAM stop layer 1301 in the RRAM portion 301 and the remaining portion of the first RRAM stop layer 307 in the logic device portion 303 may be removed at the same time to expose the top electrode 705 and metal feature 311.

Several photomasks used in the RRAM memory cell fabrication process are not used in the traditional CMOS fabrication process. The first additional photomask is one used for bottom electrode via patterning. The second additional photomask is one used for the top electrode patterning. No photomask is used for the bottom electrode patterning because a spacer is used as an etchmask. The third additional photomask is used for the top electrode via patterning. Thus, the embedded RRAM of the present disclosure may be made with three additional photomasks as compared to traditional CMOS fabrication processes without RRAM structures. In some embodiments, one of the additional photomasks may be a mask that is used in another operation that happens to have a pattern that can be reused. In some embodiments, a reusable pattern may be one of an opposite photoresist. For example, in some embodiments, the first additional photomask may be reused for the four additional photomask by designing the RRAM structure such that the bottom electrode via and the top electrode via overlaps perfectly. In other embodiments, process parameter adjustments in one or more of the photolithography operations may allow the use of a photomask that does not overlap perfectly. For example, a positive photoresist may be used instead of a negative photoresist, or vice versa, to cause a different pattern when the exposure operation is performed at an angle.

Figure 16:
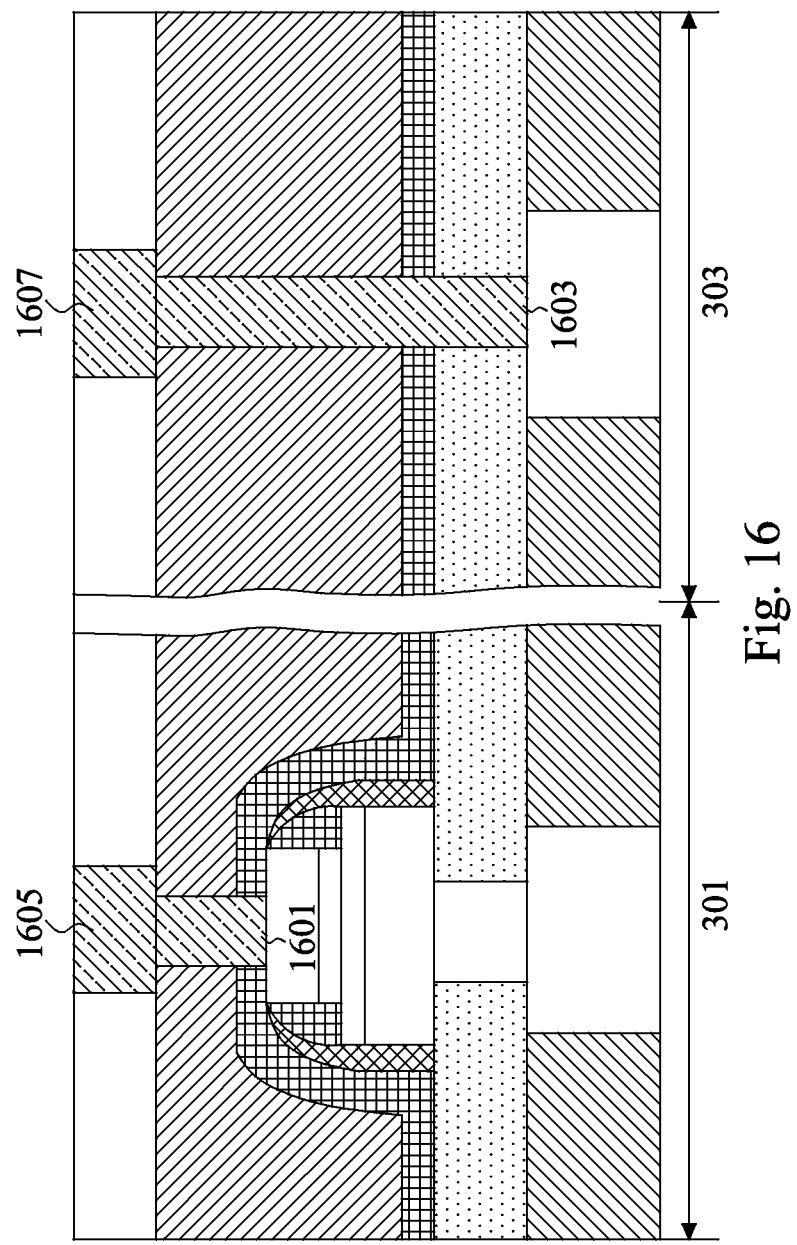

Referring back to FIG. 2, in operation 225, the top electrode via and the contact via are filled with a conductive material, usually a metal. The filling may also include one or more liner and barrier layers in additional a metal conductor. The liner and/or barrier may be conductive and deposited using CVD or PVD. The metal may be deposited using PVD or one of the plating methods, such as electrochemical plating. FIG. 16 is a cross section diagram of the partially fabricated device including a RRAM structure in a RRAM portion 301 and a logic portion 303. The top electrode via and the contact via of FIG. 16 are filled to form the top electrode contact 1601 and the contact 1603.

Referring back to FIG. 2, in operation 227 a second metal/dielectric layer is formed over the RRAM. The second metal/dielectric layer may be formed in a similar way as the first metal/dielectric layer under the RRAM structure. In some embodiments, excess metal from the top electrode via and the contact via filling are removed by planarization, new dielectric material deposited, metal line trenches patterned and etched in the new dielectric material, and metal lines filled to form the second metal/dielectric layer. In some embodiments, the metal line trenches are patterned and etched even before the top electrode via and the contact via are filled. When dimensions are such that the filling process permits, one filling operation can fill both the contacts and the metal trenches. Referring to FIG. 16, the metal line trenches 1605 and 1607 may be added to the top electrode contact 1601 and the via contact 1603, respectively. Alternatively, as the dotted lines show, the metal line trench 1605 and the top electrode contact 1601 may be formed together; and the metal line trench 1607 and the via contact 1603 may be formed together. The first metal/dielectric layer may be a fourth metal layer on the wafer and the second metal/dielectric layer may be a fifth metal layer on the wafer. After operation 227, the RRAM structure of FIG. 1 is complete in accordance with various embodiments of the present disclosure in the RRAM portion.

In one aspect, the present disclosure pertains to an RRAM cell. The RRAM cell includes a transistor; an RRAM structure, which includes a bottom electrode with a via portion and a top portion, a resistive material layer, a capping layer on the resistive material layer, a first spacer surrounding the capping layer aligned with the resistive material layer, a second spacer surrounding the resistive material layer and the top portion of the bottom electrode, and a top electrode; and a conductive material connecting the top electrode of the RRAM structure to a metal layer. The via portion of the bottom electrode is embedded in a first RRAM stop layer. The resistive material layer on the bottom electrode has a width that is same as a width of the top portion of the bottom electrode. The top electrode on the resistive material layer having a smaller width than the resistive material layer.

In another aspect, the present disclosure pertains to an RRAM cell having a transistor; an RRAM structure, and a conductive material connecting a top electrode of the RRAM structure to a metal layer. The RRAM structure includes a bottom electrode, a resistive material layer on the bottom electrode having a width that is same as a width of the bottom electrode, a capping layer, a top electrode on the capping layer, a first protective layer surrounding at least the capping layer, and a second protective layer surrounding the first protective layer, the resistive material layer, and a portion of the bottom electrode. The top electrode and the capping layer have a same width smaller than a width of the bottom electrode and said protective layer is entirely disposed on the resistive material layer.

In yet another aspect, the present disclosure pertains to a method for making a RRAM cells. The method includes forming a transistor on a semiconductor substrate, depositing a bottom electrode layer, depositing a resistive material layer, depositing a capping layer, depositing a top electrode layer, depositing a top electrode protective layer, forming a top electrode by patterning and etching the top electrode protective layer, top electrode layer and the capping layer, forming a first spacer around the top electrode protective layer, the top electrode and the capping layer, forming a bottom electrode by patterning and etching the bottom electrode layer using the first spacer as an etch mask, and forming a second spacer around the bottom electrode and the first spacer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of making a resistive random access memory (RRAM) cell, the method comprising:
   forming a transistor on a semiconductor substrate;
   depositing a bottom electrode layer;
   depositing a resistive material layer;
   depositing a capping layer;
   depositing a top electrode layer;
   depositing a top electrode protective layer;
   forming a top electrode by patterning and etching the top electrode protective layer, the top electrode layer and the capping layer;
   forming a first spacer around the top electrode protective layer, the top electrode and the capping layer;
   forming a bottom electrode by patterning and etching the bottom electrode layer using the first spacer and the top electrode protective layer as an etch mask; and
   forming a second spacer around the bottom electrode and the first spacer.

2. The method of claim 1, further comprising forming two or more metal interconnect layers between the transistor and the bottom electrode layer.

3. The method of claim 1, further comprising:
   depositing a RRAM stop layer and a dielectric layer;
   etching a top electrode via in the dielectric layer and the RRAM top layer; and
   filling the top electrode via with a metal.

4. The method of claim 1, wherein the top electrode layer is tantalum nitride, titanium nitride, or platinum.

5. The method of claim 1, wherein the spacer comprises a material that has a higher etch selectivity than a patterned hardmask during bottom electrode etching.

6. The method of claim 1, wherein the top electrode protective layer is substantially removed during the bottom electrode etching.

7. The method of claim 1, wherein the top electrode protective layer is silicon oxynitride.

8. The method of claim 1, wherein the first spacer comprises silicon nitride, carbon doped silicon nitride, or silicon carbide.

9. The method of claim 1, wherein the first spacer and the second spacer comprise a same material.

10. A method comprising:
   forming a first metal interconnect in a first dielectric layer;
   forming a first stop layer on the first metal interconnect and the first dielectric layer;
   patterning the first stop layer to form a first opening therein, the first opening exposing the metal interconnect;
   depositing a bottom electrode layer on the first stop layer, the bottom electrode layer filling the first opening and electrically contacting the first metal interconnect;
   forming atop the bottom electrode layer, in sequence, a resistive material layer, a capping layer, a top electrode layer, and a top electrode protective layer;
   patterning the top electrode protective layer, the top electrode layer, the capping layer, and the resistive material layer with a first pattern;
   forming a first spacer on sidewalls of the patterned top electrode protective layer, the top electrode layer, the capping layer, and the resistive material layer;
   patterning the resistive material layer and the bottom electrode layer using the first spacer as a mask; and
   forming a second spacer on sidewalls of the patterned top electrode layer, the patterned capping layer, the patterned resistive material layer, and the patterned bottom electrode layer.

11. The method of claim 10 further comprising:
   depositing a second stop layer over the second spacer and the first stop layer;
   depositing a second dielectric layer over the second stop layer; and
   forming a top electrode contact in the second dielectric layer.

12. The method of claim 10, wherein the step of forming a first spacer removes the patterned top electrode protective layer.

13. The method of claim 10, wherein the patterned bottom electrode layer includes a top portion above the first stop layer and a via portion with the first stop layer.

14. The method of claim 11, further comprising:
   forming logic device contact in the second dielectric.

15. The method of claim 10, wherein the step of forming atop the bottom electrode layer, in sequence, a resistive material layer, a capping layer, a top electrode layer, and a top electrode protective layer includes:
   depositing an oxide of W, Ta, Ti, Ni, Co, Hf, Ru, Zr, Fn, Fe, Sn, Al, Cu, Ag, Mo, or Cr for the resistive material layer;
   depositing on the resistive material layer, titanium, hafnium, platinum, or tantalum as the capping layer;
   depositing on the capping layer a metal, metal nitride, or doped polysilicon for the top electrode layer; and
   depositing on the top electrode layer silicon oxynitride, silicon carbide, carbon-doped silicon nitride, or silicon nitride as the top electrode protective layer.

16. The method of claim 10, wherein the patterned resistive material layer and a top portion of the patterned bottom electrode layer have a same first cross-sectional width, and the patterned top electrode layer and patterned capping layer have a same second cross-sectional width, the first cross-sectional width being greater than the second cross-sectional width.

17. A method comprising:
   forming on a substrate a first stop layer, a first conductor layer on the first stop layer, a capping layer on the first conductor layer, a resistive material layer on the first conductor layer, a capping layer on the resistive material layer, a second conductor layer on the resistive material layer, and a protection layer on the second conductor layer;
   patterning the capping layer, the second conductor layer, and the protection layer to form a patterned second conductor;
   forming a first spacer on sidewalls of the patterned second conductor;
   patterning the resistive material layer and the first conductor layer using the first spacer and the patterned second conductor as a mask to form a patterned first conductor;
   forming a second stop layer on sidewalls of the patterned first conductor and the patterned second conductor; and
   forming an electrical contact to the patterned second conductor.

18. The method of claim 17, wherein the step of forming a first spacer removes the protection layer.

19. The method of claim 17, wherein the step of patterning the resistive material layer and the first conductor layer removes the protection layer.

20. The method of claim 17, wherein the patterned first conductor extends into the first stop layer.

* * * * *